United States Patent
Ashita et al.

(10) Patent No.: US 8,848,828 B2
(45) Date of Patent: Sep. 30, 2014

(54) DISTORTION COMPENSATION CIRCUIT, TRANSMITTING APPARATUS AND DISTORTION COMPENSATING METHOD

(75) Inventors: Junya Ashita, Tokyo (JP); Teppei Shoji, Tokyo (JP)

(73) Assignees: NEC Corporation, Tokyo (JP); Hitachi Kokusai Electric Inc., Tokyo (JP)

( * ) Notice: Subject to any disclaimer, the term of this patent is extended or adjusted under 35 U.S.C. 154(b) by 491 days.

(21) Appl. No.: 13/141,230

(22) PCT Filed: Dec. 3, 2009

(86) PCT No.: PCT/JP2009/070336
§ 371 (c)(1),
(2), (4) Date: Jun. 21, 2011

(87) PCT Pub. No.: WO2010/073889
PCT Pub. Date: Jul. 1, 2010

(65) Prior Publication Data
US 2011/0255636 A1    Oct. 20, 2011

(30) Foreign Application Priority Data
Dec. 22, 2008    (JP) .................. 2008-325617

(51) Int. Cl.
H04K 1/02    (2006.01)
H03F 1/32    (2006.01)
H03F 3/189    (2006.01)
H04L 27/36    (2006.01)
H03F 3/24    (2006.01)

(52) U.S. Cl.
CPC .............. *H03F 1/3247* (2013.01); *H03F 3/189* (2013.01); *H04L 27/368* (2013.01); *H03F 3/24* (2013.01); *H03F 2200/336* (2013.01); *H03F 1/3258* (2013.01)

USPC ............ 375/297; 375/296; 375/324; 375/254

(58) Field of Classification Search
USPC ........................ 375/297, 296, 324, 354, 254
See application file for complete search history.

(56) References Cited

U.S. PATENT DOCUMENTS

| | | | |
|---|---|---|---|
| 5,617,058 A | 4/1997 | Adrian et al. | |
| 6,724,831 B1 | 4/2004 | Hasegawa et al. | |
| 6,757,525 B1* | 6/2004 | Ishikawa et al. ........... | 455/114.3 |
| 2003/0179831 A1* | 9/2003 | Gupta et al. ................. | 375/296 |
| 2006/0029155 A1 | 2/2006 | Shako et al. | |

FOREIGN PATENT DOCUMENTS

| | | |
|---|---|---|
| JP | 11-239191 | 8/1999 |
| JP | 2001-251148 | 9/2001 |
| JP | 2002-152289 | 5/2002 |

(Continued)

OTHER PUBLICATIONS

International Search Report, PCT/JP2009/070336, Mar. 9, 2010.

*Primary Examiner* — Kabir A Timory
(74) *Attorney, Agent, or Firm* — Young & Thompson (57) ABSTRACT

A distortion compensation circuit for compensating for the distortion characteristics of an amplifier, includes a distortion compensating coefficient calculating element and a distortion compensating operation element. The distortion compensating coefficient calculating element calculates a distortion compensating coefficient to be used for compensation of the distortion characteristics by comparing an input signal with the output signal amplified by the amplifier. The distortion compensating operation element performs a distortion compensating operation on the input signal, using a variably set bit format and the distortion compensating coefficient calculated by the distortion compensating coefficient calculating element.

18 Claims, 5 Drawing Sheets

(56) References Cited

FOREIGN PATENT DOCUMENTS

| JP | 2003-168931 | 6/2003 |
|---|---|---|
| JP | 2003-318661 | 11/2003 |
| JP | 2004-032609 | 1/2004 |
| JP | 2004-080696 | 3/2004 |
| JP | 3699602 | 7/2005 |
| JP | 2006-050183 | 2/2006 |
| JP | 2008-258714 | 10/2008 |
| JP | 4212647 | 11/2008 |

\* cited by examiner

DISTORTION COMPENSATION CIRCUIT, TRANSMITTING APPARATUS AND DISTORTION COMPENSATING METHOD

TECHNICAL FIELD

The present invention relates to a technology of compensating for distortion that is caused in a signal by an amplifier.

BACKGROUND ART

In the field of recent digital high-speed radio communication systems, CDMA (Code Division Multiple Access) modulation and/or OFDM (Orthogonal Frequency Division Multiplexing) modulation are used. These multiplexed modulated waves based on the modulation schemes are characterized in that instantaneous power (peak factor, crest factor) is extremely high compared to the average power.

Therefore, the power amplifier for transmission that is provided in the transmitter of a radio communication apparatus is required to suppress leakage power to adjacent channels to a low level when amplifying a signal. Accordingly, the requirement is that the linearity of the power amplifier for transmission be kept up to an extremely high output level so as to suppress spreading of the transmission spectrum due to non-linear distortion.

However, power amplifiers having good linearity up to a level where the amplitude component is markedly large, tend to be large in size and become high in price and in power consumption.

For this reason, in general power amplifiers which exhibit good linear characteristics within a certain range in which the amplitude component is small but which present non-linear characteristics in the range in which the amplitude component is not smaller than the former range, are often used. When a power amplifier exhibiting non-linearity is used, if a large back-off is taken, the amplifier can keep up linearity in the operation range but these results in inefficiency. In contrast, if the back-off is made small, the amplifier can present high efficiency but will produce output signals having distorted waveforms. As a result, the distorted component of the radio transmission signal is prone to leak to adjacent channels.

To deal with this, various proposals in distortion compensation technologies have as their object the suppression of adjacent channel leakage that is caused by non-linear distortion in power amplifiers. Of these, the digital pre-distortion scheme can be mentioned as the distortion compensation technique that has been adopted most frequently in recent years.

Distortion compensation based on the digital pre-distortion scheme compensates for non-linear distortion in AM/AM characteristics (amplitude characteristics) and AM/PM characteristics (phase characteristics) arising in a power amplifier. The distortion compensation circuit digitally compares the transmission signal with the feedback signal to thereby obtain non-linear characteristics of the power amplifier. Then, the circuit determines the distortion compensating coefficient representing inverse characteristics of the non-linear characteristics and complex multiplies the transmission signal by that distortion compensating coefficient. The signal obtained by this complex multiplication is input to the power amplifier. As a result, the signal output from the power amplifier exhibits approximate linear characteristics.

JP2004-32609A and JP2008-258714 disclose circuits for compensating non-linear distortion by digital pre-distortion schemes.

The non-linear distortion compensation circuit disclosed in JP2004-32609A compensates for non-linear distortion by multiplying the input signal by a compensation value in conformity with the input amplitude. In particular, in this non-linear distortion compensation circuit, the memory capacity is reduced by previously storing distortion compensation coefficients in an alternate manner and interpolating the distortion compensation coefficients located between the stored distortion compensation coefficients.

The power amplifier disclosed in JP2008-258714A performs compensation by using compensation data output from a lookup table in accordance with the amplitude of the input data. In particular, in this power amplifier, the dynamic range of the amplifier is enlarged by using different lookup tables for a large signal region and for a small signal region, in accordance with the amplitude of the input data.

SUMMARY OF THE INVENTION

Problems to be Solved by the Invention

Power amplifiers provided for the transmitter of radio communication apparatuses are different in characteristics, and the amount of compression at the saturated output point differs depending on individual power amplifiers. The amount of compression is the amount of compression from the ideal linear gain to the actual gain. If the amount of compression at the saturated output point is different, the characteristics of the signal output from the power amplifier differ so that the power value of the signal after the distortion compensating operation, to be input to the power amplifier, becomes different. Accordingly, if the amount of compression at the saturated output point is different, the range of the numerical value to be expressed as the amplitude of a digital signal becomes different.

Digital signals used in distortion compensation by the digital pre-distortion scheme are expressed with a predetermined number of bits in the digital circuit. When the amplitude of a signal is expressed with a predetermined number of bits, there arises a tradeoff relation between the expression accuracy and the range of expressible numerical values. If the number of bits is increased, the expression accuracy and the range of the expressible numerical value can be made compatible. However, this entails enlargement of circuit size and an increase in cost.

When applied to an actual radio communication apparatus, the non-linear characteristic of the power amplifier is verified in advance, and based on the result, the number of bits and bit format are determined In particular, when a fixed-point operation is used, there occur cases where the operation result exceeds the expressible range and becomes saturated, producing an incorrect result. Therefore, previous verification is important.

Herein, a case of expressing a signal in 16-bit fixed-point format will be considered as one example.

Figure 1:
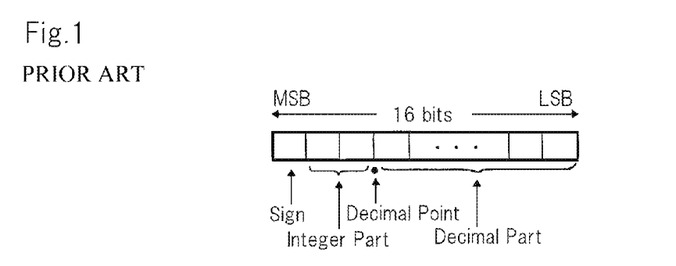
[FIG. 1] is a diagram showing a 16-bit fixed-point type signed Q13 format.

FIG. 1 is a diagram showing a 16-bit fixed-point type signed Q13 format. In this bit format, one bit is used for expressing the sign, two bits for expressing the integer part, and 13 bits for expressing the decimal part. With this bit format, it is possible to express a numerical value falling within the range from −3.99 . . . to +3.99 . . . .

Figure 2:
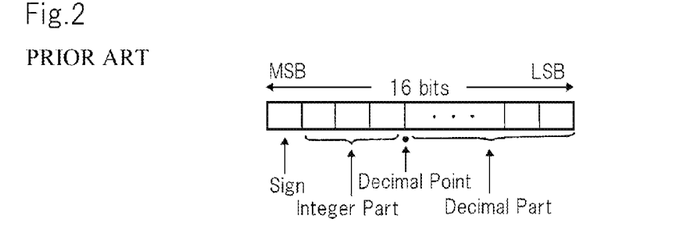
[FIG. 2] is a diagram showing a 16-bit fixed-point type signed Q12 format.

On the other hand, FIG. 2 is a diagram showing a 16-bit fixed-point type signed Q12 format. In this bit format, one bit is used for expressing the sign, three bits for expressing the integer part, and 12 bits for expressing the decimal part. With this bit format, it is possible to express a numerical value falling within the range from −7.99 . . . to +7.99 . . . .

Figure 3:
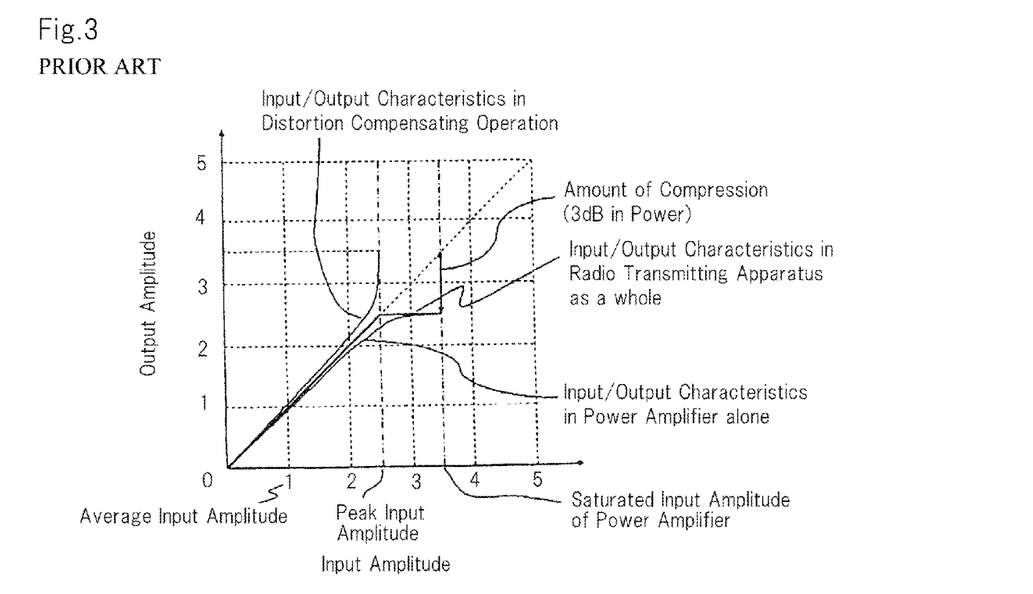
[FIG. 3] is a graph showing non-linear characteristics and signal characteristics after non-linear distortion compensation is performed in a power amplifier of a first example.
Figure 4:
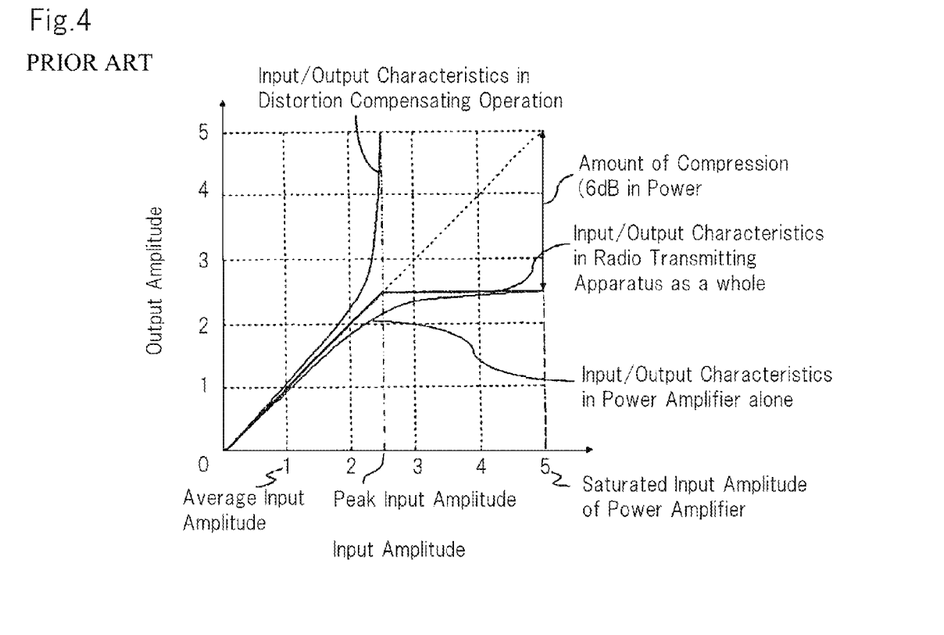
[FIG. 4] is a graph showing non-linear characteristics and signal characteristics after non-linear distortion compensation is performed in a power amplifier of a second example.

FIG. 3 is a graph showing non-linear characteristics and signal characteristics after non-linear distortion compensation in a power amplifier of a first example. FIG. 4 is a graph showing non-linear characteristics and signal characteristics after non-linear distortion compensation in a power amplifier of a second example. The horizontal axis in FIGS. 3 and 4 denotes input amplitude and the vertical axis denotes output amplitude. The input amplitude and output amplitude are normalized by the average input amplitude 1.0.

In the first example shown in FIG. 3, the upper-limit of distortion-compensateable input amplitude in the input/output characteristics of the power amplifier is about 2.5. The power amplifier is saturated at the input amplitude of 3.5. As understood from FIG. 3, the amount of compression at the saturated output point of the power amplifier is about 3 dB in terms of power value. In general, as distortion compensation characteristics, inverse characteristics of the non-linear characteristics of the power amplifier are used. If such distortion compensation characteristics are used, the input/output characteristics of the distortion compensating operation present the characteristics shown in FIG. 3. The amplitude after the distortion compensating operation on the peak input amplitude of 2.5 is 3.5 (=2.5×1.4).

When 3.5, the amplitude after the distortion compensating operation is assumed to be expressed in a 16-bit fixed-point representation, the bit format that can express this with the highest precision is the signed Q13 format in FIG. 1.

On the other hand, also in the second example shown in FIG. 4, the upper-limit of distortion-compensateable input amplitude in the input/output characteristics of the power amplifier is about 2.5. However, in the second example, the power amplifier is saturated at the input amplitude of 5.0. Accordingly, as understood from FIG. 4, the amount of compression at the saturated output point of the power amplifier is about 6 dB in terms of power value. Therefore, the input/output characteristics of the distortion compensating operation exhibit the characteristics as shown in FIG. 4. The amplitude after the distortion compensating operation on the peak input amplitude of 2.5 falls at 5.0 (=2.5×2).

This amplitude, 5.0 cannot be expressed in the signed Q13 format in FIG. 1. The bit format that can express the amplitude, 5.0 with the highest precision is the signed Q12 format in FIG. 2.

As described above, there have been cases where it is impossible to perform distortion compensation with the desired precision because the bit format suitable to the distortion compensation circuit changes depending on the characteristics of the power amplifier. For example, there has been a case where the circuit of the distortion compensation circuit as a whole has to be altered in order to change the specifications of a power amplifier.

In the power amplifying apparatus disclosed in JP2008-258714, lookup tables are changed depending on the amplitude of input data. However, it is impossible to deal with change in characteristics of the power amplifier. Therefore, there occur cases where the distortion compensation circuit as a whole needs to be altered with alternation of the power amplifier.

The object of the present invention is to provide a technology that enables application of a suitable bit format in conformity with amplifier characteristics to distortion compensation of an amplifier.

Means for Solving the Problems

In order to achieve the above object, the distortion compensation circuit of the present invention is a distortion compensation circuit for compensating for the distortion characteristics of an amplifier, including:

a distortion compensating coefficient calculating means that calculates a distortion compensating coefficient to be used for compensation of the distortion characteristics by comparing an input signal with the output signal amplified by the amplifier; and, a distortion compensating operation means that performs a distortion compensating operation on the input signal, using a variably set bit format and the distortion compensating coefficient calculated by the distortion compensating coefficient calculating means.

The transmitter of the present invention is a transmitting apparatus for transmitting a signal whose distortion characteristics are compensated for, including:

a distortion compensating coefficient calculating means that calculates a distortion compensating coefficient to be used for compensation of the distortion characteristics by comparing an input signal with the signal obtained by feeding back a transmission signal;

a distortion compensating operation means that performs an operation of distortion compensation on the input signal, using a variably set bit format and the distortion compensating coefficient calculated by the distortion compensating coefficient calculating means, to output a signal after the distortion compensating operation is performed; and, an amplifier that generates the transmission signal by amplifying the signal after a distortion compensating operation is output from the distortion compensating operation means.

The distortion compensating method is a distortion compensating method for compensating for the distortion characteristics of an amplifier, including the steps of:

calculating a distortion compensating coefficient to be used for compensation of the distortion characteristics by comparing an input signal with the output signal amplified by the amplifier; and, performing a distortion compensating operation on the input signal, using a variably set bit format and the calculated distortion compensating coefficient.

MODE FOR CARRYING OUT THE INVENTION

The mode for carrying out the present invention will be described in detail with reference to the drawings.

Figure 5:
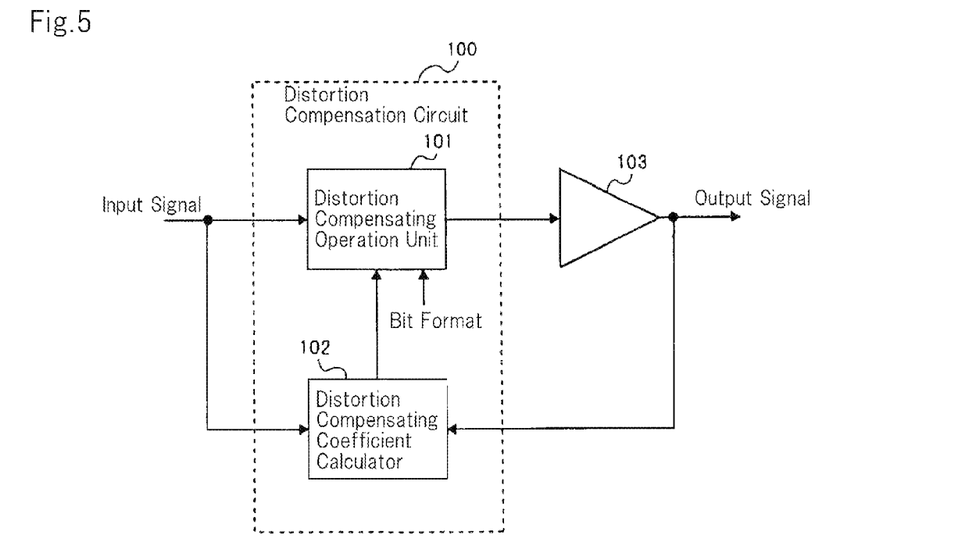
[FIG. 5] is a block diagram showing a schematic configuration of a distortion compensation circuit according to the present exemplary embodiment.

FIG. 5 is a block diagram showing a schematic configuration of a distortion compensation circuit according to the present exemplary embodiment. Referring to FIG. 5, distortion compensation circuit 100 includes distortion compensating coefficient calculator 101 and distortion compensating operation unit 102.

Distortion compensation circuit 100 is a circuit for compensating for the distortion characteristics of amplifier 103.

Distortion compensating coefficient calculator 101 calculates distortion compensating coefficients used for distortion characteristic compensation by comparing the input signal with output signal that was amplified by amplifier 103.

Distortion compensating operation unit 102 performs a distortion compensating operation on the input signal, using a variably set up bit format and the distortion compensating coefficients calculated by distortion compensating calculator 101.

According to the present exemplary embodiment, since calculation for distortion compensation is performed using the set up bit format, it is possible to set up an appropriate bit format in accordance with the characteristics of amplifier 103 and apply the bit format to distortion compensation.

The above-described distortion compensation circuit 100 of the present exemplary embodiment may also be configured to set up an appropriate bit format by itself, or may be configured so as to be externally set up with an appropriate bit format.

When distortion compensation circuit 100 determines the bit format by itself, the circuit should further include a configuration in which a bit format is set up by calculating the maximum amplitude of the distortion-compensated signal input to amplifier 103, which is determined in accordance with the amount of compression at the saturated output point of amplifier 103, based on the distortion compensation coefficients calculated at distortion compensation calculator 101 so as to be able to express the calculated maximum amplitude. With this configuration, the bit format that can express the maximum amplitude of the distortion-compensated signal input to amplifier 103 is automatically set up, so that it is possible to apply an appropriate bit format to distortion compensation in accordance with the characteristics of amplifier 103 without need of user setup.

Further, in this case, distortion compensation circuit 100 may and should be adapted to select the bit format that can express the amplitude with the highest precision from those that can express the maximum from amplitude, among a plurality of predetermined bit format candidates. Thus, it is possible to set up a format that can express the maximum amplitude of the distortion-compensated signal input to amplifier 103 and that can express the amplitude with high precision.

Further, distortion compensation circuit 100 may also be adapted to adaptively control the bit format to be used in non-linear distortion compensating operation unit 102, continuously during performing distortion compensation. With this configuration, it is possible to use the bit format that is suited to the characteristics of amplifier 103, adaptively to an alteration or change when amplifier 103 is altered or when the characteristics of amplifier 103 change.

(The First Exemplary Embodiment)

Figure 6:
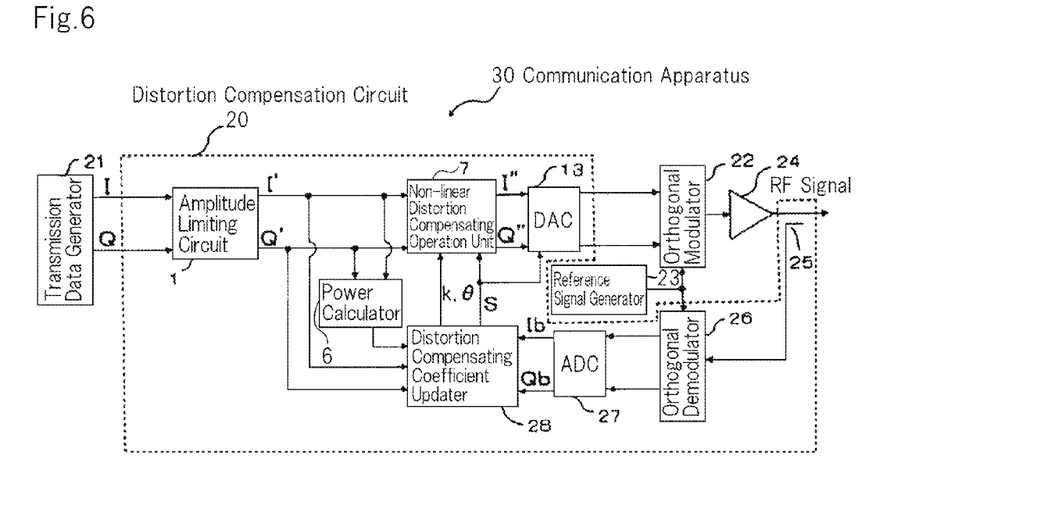
[FIG. 6] is a block diagram showing a transmitting apparatus configuration according to the first exemplary embodiment.

FIG. 6 is a block diagram showing a transmitting apparatus configuration according to the first exemplary embodiment. Referring to FIG. 6, transmitting apparatus 30 includes distortion compensation circuit 20, transmission data generator 21, orthogonal modulator 22, reference signal generator 23 and power amplifier 24. Distortion compensation circuit 20 includes amplitude limiting circuit 1, non-linear distortion compensating operation unit 7, DAC (Digital-Analog Converter) 13, non-linear distortion compensating operation unit 7, directivity coupler 25, orthogonal demodulator 26, ADC (Analog-Digital Converter) 27, distortion compensating coefficient updater 28 and power calculator 6. Here, it is assumed in the present exemplary embodiment that digital signal processing operations in distortion compensation circuit 20 are of a fixed-point type. The fixed-point type supports a narrower range of expressible values compared to the floating-point type, but can execute high-speed operations thanks to easy processing.

Amplitude limiting circuit 1 limits digital orthogonal baseband signals I and Q from transmission data generator 21 to a certain power threshold Pth or below. Amplitude limiting circuit 1 may use a usual amplitude limiting method. As examples of usual amplitude limiting methods, circular clipping methods and methods using a window function are well known.

In the method using circular clipping, the power values of orthogonal baseband signals I and Q are calculated so that the signal that exceeds the power threshold is limited in amplitude while the phase of the signal is maintained.

In the amplitude limiting method using a window function, when power value x of orthogonal baseband signals I and Q is greater than power threshold y, a convex down window function having an extreme at $(y/x)^{1/2}$ is generated, and the power points exceeding the threshold and its surrounding signals are multiplied by the aforementioned function having a certain time width. As examples of window functions, Hanning window and Kaiser window are well known.

Non-linear distortion compensating operation unit 7 performs a distortion compensating operation by complex multiplication on orthogonal baseband signals I' and Q' that are limited in amplitude by amplitude limiting circuit 1. In this distortion compensating operation, the signal amplitude is represented in bit format S that is set up by distortion compensating coefficient updater 28, and distortion compensating coefficients K and θ from distortion compensating coefficient updater 28 are used for complex multiplication.

DAC 13 converts the orthogonal baseband signals I" and Q" after implementation of the distortion compensating operation by non-linear distortion compensating operation unit 7, into analog signals, to thereby generate analog orthogonal baseband signals. Since the orthogonal baseband signals I" and Q" input to DAC 13 are represented in bit format S that is set up by distortion compensating coefficient updater 28, DAC 13 performs a conversion process in conformity with the bit format S.

Orthogonal modulator 22 converts the analog orthogonal baseband signals generated by DAC 13 into orthogonal modulation signals by orthogonal modulation using the reference signal from reference signal generator 23.

Power amplifier 24 amplifies the power of the orthogonal modulation signals generated by orthogonal modulator 22 and outputs the result as a RF (Radio Frequency) signal. Part of this output from power amplifier 24 is fed back to orthogonal modulator 26 via directivity coupler 25.

Orthogonal &modulator 26 demodulates the RF signal fed back by directivity coupler 25 to analog orthogonal baseband signals, using the reference signal from reference signal generator 23.

ADC 27 converts the analog orthogonal baseband signals from orthogonal demodulator 26 into digital signals, to thereby generate digital orthogonal baseband feedback signals Ib and Qb.

Distortion compensating coefficient updater 28 compares digital orthogonal baseband feedback signals Ib and Qb from ADC 27 with orthogonal baseband signals I' and Q' from amplitude limiting circuit 1 to update distortion compensating coefficients K and $\theta$. Further distortion compensating coefficient updater 28, based on the distortion compensating coefficients K and $\theta$, calculates the maximum amplitudes of the distortion-compensated signals to determine bit format S so as to be able to express the maximum amplitude. Distortion compensating coefficients K and $\theta$ and bit format S from distortion compensating coefficient updater 28 are notified to non-linear distortion compensating operation unit 7.

Specifically, distortion compensating coefficients K and $\theta$ calculated by distortion compensating coefficient updater 28 are stored into memory in the form of distortion compensating coefficients K and $\theta$ corresponding to the power value. Power calculator 6 calculates the power value of orthogonal baseband signals I' and Q' from amplitude limiting circuit 1. Non-linear distortion compensating operation unit 7 accesses the memory, regarding the power value from power calculator 6 as the address, to acquire distortion compensating coefficients K and $\theta$. These distortion compensating coefficients K and $\theta$ are used for a distortion compensation operation.

It should be noted that FIG. 6 is a configurational example of the present invention, and the present invention can also be applied to other configurations. For example, orthogonal modulation and orthogonal demodulation may be performed in a digital scheme. Instead of orthogonal modulation, frequency conversion may be performed. Further, instead of using the power value from power calculator 6 as the address, the amplitude value which is the square root of the power value may be calculated so as to acquire the distortion compensating coefficients using the amplitude value as the address.

Figure 7:
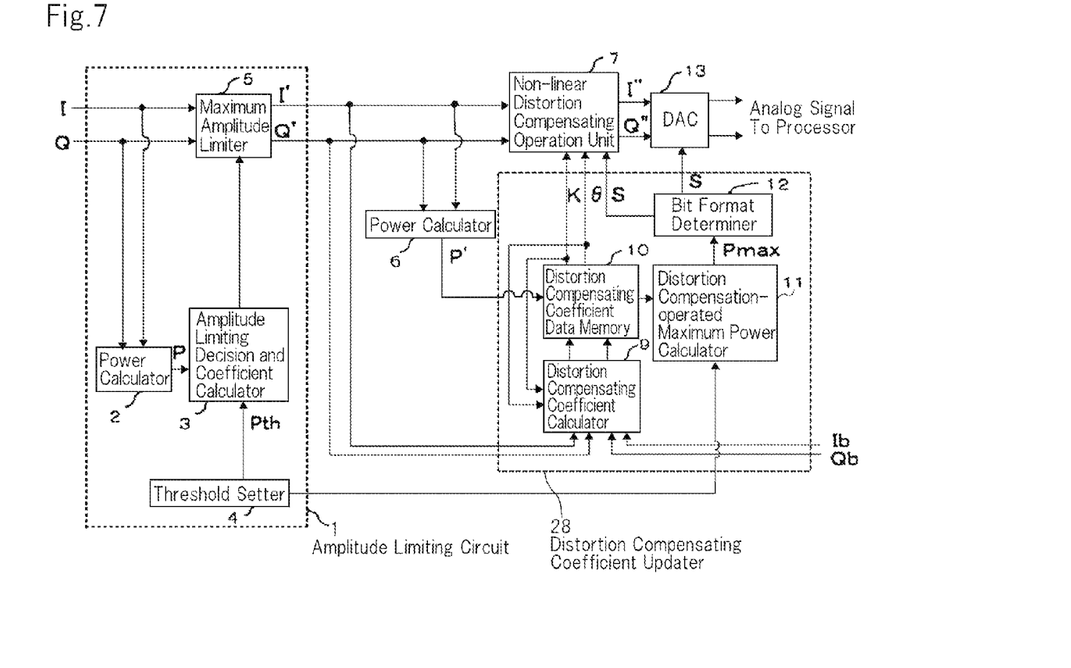
[FIG. 7] is a block diagram showing a configuration of the essential part of a distortion compensation circuit according to the first exemplary embodiment.

FIG. 7 is a block diagram showing a configuration of the essential part of the distortion compensation circuit according to the first exemplary embodiment. Referring to FIG. 7, amplitude limiting circuit 1 of the present exemplary embodiment is an example of a circular clipping type, and includes power calculator 2, amplitude limiting decision and coefficient calculator 3, threshold setter 4 and maximum amplitude limiter 5. Distortion compensating coefficient updater 28 includes distortion compensating coefficient calculator 9, distortion compensating coefficient data memory 10, distortion compensation-operated maximum power value calculator 11 and bit format determiner 12.

Amplitude limiting circuit 1 uses a circular clipping scheme as an example, to limit the power of digital orthogonal baseband signals I and Q to power threshold Pth or below.

Power calculator 2 calculates the power value P $(=I^2+Q^2)$ of orthogonal baseband signals I and Q and outputs the result to the amplitude limit decision and coefficient calculator 3.

Amplitude limit decision and coefficient calculator 3 compares power value P from power calculator 2 with power threshold Pth given from threshold setter 4, calculates a coefficient so that power value P will be equal to power threshold Pth or below, and outputs the coefficient to maximum amplitude limiter 5. For example, when power value P is equal to or lower than power threshold Pth, amplitude limit decision and coefficient calculator 3 determines not to perform amplitude limitation and outputs 1 as a multiplying coefficient. On the other hand, when power value P is greater than power threshold Pth, amplitude limit decision and coefficient calculator 3 determines to perform amplitude limitation and output $(Pth/P)^{1/2}$ as a multiplying coefficient.

Maximum amplitude limiter 5 multiplies the I and Q components of the orthogonal baseband signal by the multiplying coefficient from amplitude limit decision and coefficient calculator 3 to perform maximum amplitude limitation.

Non-linear distortion compensating operation unit 7 performs complex multiplication (distortion compensating operation) on orthogonal baseband signals I' and Q' after implementation of limitation by maximum amplitude limiter 5, based on the distortion coefficients K and $\theta$ calculated at distortion compensating coefficient updater 28 and bit format control signal S, and outputs the distortion-compensated signals I" and Q" to DAC 13.

DAC 13 recognizes the bit format of digital distortion-compensated signals I" and Q", in accordance with bit format control signal S notified from bit format determiner 12. Then, DAC 13 converts the digital signals I" and Q" represented in that bit format, into analog signals and outputs the signals to an analog signal processor (not shown). The analog signal processor is not illustrated in FIG. 7, but is an analog circuit section inducing orthogonal modulator 22 and power amplifier 24 shown in FIG. 6.

The example herein shows that DAC 13 is a type that can appropriately alter the bit format at the DAC input portion. Accordingly, DAC 13 sets up a bit format shown by bit format control signal S notified from bit format determiner 12, and performs digital-to-analog conversion of a correct level suited to the bit format. However, the present invention should be limited to this example.

As another example, DAC 13 may be a fixed type that cannot alter the bit format in the DAC input portion. In this case, DAC 13, presuming that the input signal is a signal of the determined fixed bit format, performs a conversion process on that input signal. Then, the level difference due to the difference between the fixed bit format and the bit format of the actual input signal may be adjusted based on the bit format notified from bit format determiner 12 until the output signal from DAC 13 is input to power amplifier 24.

Distortion compensating coefficient calculator 9, comparing orthogonal baseband input signals I' and Q' with the orthogonal baseband feedback signals Ib and Qb of which part of the output from the power amplifier was modulated into digital signals, on the polar coordinates, calculates amplitude error and phase error, to thereby calculate distortion compensating coefficients based on the calculation. The amplitude error and phase error on the polar coordinates correspond to the amount of compression.

Distortion compensating coefficient data memory 10 stores the distortion compensating coefficients calculated at distortion compensating coefficient calculator 9, in association with power value P' calculated at power calculator 6.

Power calculator 6 calculates power value P' $(=I'^2+Q'^2)$ from amplitude-limited orthogonal baseband signals I' and Q' and outputs the calculated result to distortion compensating coefficient data memory 10.

Distortion compensation-operated maximum power value calculator 11, referring to distortion compensating coefficient data memory 10, calculates the power value after distortion compensation operation for power threshold Pth given from threshold setter 4 is performed. Since the input power is limited to power threshold Pth or below, the power value after the distortion compensation operation for power threshold Pth is performed becomes the maximum power value Pmax after distortion compensating operation. Distortion compensation-operated maximum power value calculator 11 outputs this maximum power value Pmax to bit format determiner 12.

Bit format determiner 12 determines the bit format with a predetermined number of bits that can express this maximum power value Pmax with the highest precision. A bit format in which the integer part of the maximum power value Pmax is expressed with as small a number of bits as possible, and in which the remaining number of bits are allotted to the decimal part of the maximum power value Pmax, becomes the highest accurate bit format. Bit format determiner 12 notifies the determined bit format information as a bit format control signal to non-linear distortion compensating operation unit 7 and DAC 13.

Figure 8:
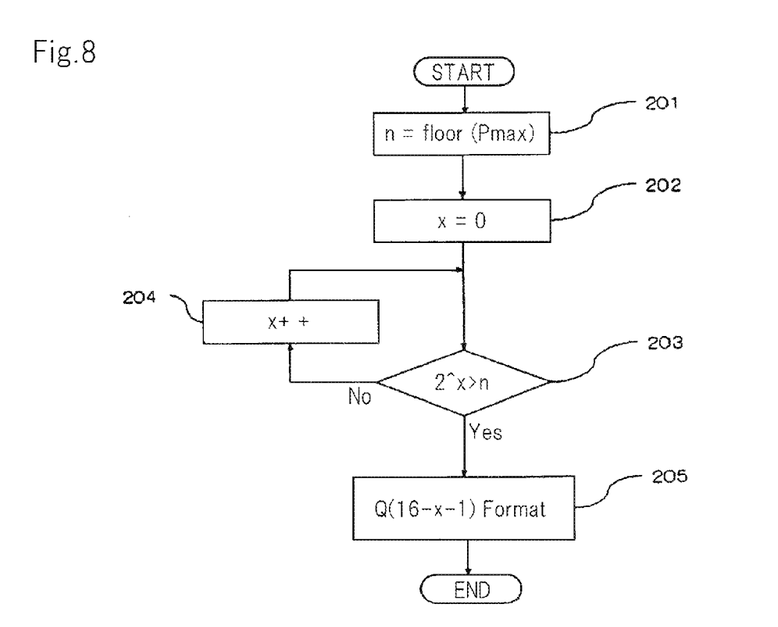
[FIG. 8] is a flow chart showing one example of a specific process for determining a bit format in the first exemplary embodiment.

FIG. 8 is a flow chart showing one example of a specific process for determining the bit format in the first exemplary embodiment. Here, an example of 16-bit fixed-point operation will be given but the processing procedure is the same with that of another number of bits.

First, at Step 201, bit format determiner 12 determines integer part n of maximum power value Pmax after distortion compensating operation is performed. The function floor( ) shown at Step 201 in FIG. 8 is a function that returns the maximum integer value equal to or less than an argument by discarding all the numbers after the decimal point of the argument. Since the maximum power value Pmax is equal to or greater than 0, integer n is a positive integer inclusive of 0.

Next, bit format determiner 12 initializes variable x to 0 at Step 202. Then, bit format determiner 12 determines the size relationship between 2 to the power of x and integer n, at Step 203. This is the process of calculating how many bits are needed for expressing integer n.

If $2^x > n$ holds, bit format determiner 12 goes to Step 205 to determine the bit format. If $2^x \leq n$ holds, bit format determiner 12 goes to Step 204 to increment variable x and returns Step 203.

In the above process, the value of x when 2 to the power of x is greater than n is the least number of bits that express the integer part of maximum power value Pmax. When the integer part is expressed with as small a number of bits as possible while the sign and decimal part are expressed with the remaining number of bits, the accuracy of the resultant numerical value will become maximum.

For this, bit format determiner 12 determines signed Q(16−x−1) format by taking x bits for the integer part and (16−x−1) bits for the decimal part.

Other than the method shown in FIG. 8, there are methods for determining the number of bits that express the integer part of the maximum power value Pmax. As other methods, a method of calculating Log (base=2) of the maximum power value Pmax and a method of performing bit shift of Pmax can be considered.

Alternatively, it is also possible to directly determine the bit format from the integer part of the maximum power value Pmax. For example, a table relating the integer part of Pmax with bit format is prepared beforehand so that the bit format can be determined by referring to that table.

In this way, other than these methods there have been many known methods to determine the integer part of a certain value and to calculate the number of bits needed to express that integer. In the present invention, any method can be used.

As described heretofore, according to the present exemplary embodiment, it is possible to adaptively determine a bit format that can express the maximum power value with the highest accuracy for arbitrary compression characteristics depending on power amplifier 24. As a result, it is possible to realize highly accurate distortion compensation without causing any saturation due to a distortion compensating operation while minimizing the influence of a rounding error.

(The Second Exemplary Embodiment)

The basic configuration of a transmitting apparatus according to the second exemplary embodiment is the same as the transmitting apparatus of the first exemplary embodiment shown in FIGS. 5 to 7. Though, in the first exemplary embodiment, the bit format is determined by the process shown in FIG. 8, a bit format is determined in the second exemplary embodiment by using a process that is different from that of the first exemplary embodiment.

In the second exemplary embodiment, bit format is determined by the cooperative operations of distortion compensation-operated maximum power value calculator 11 and bit format determiner 12.

Figure 9:
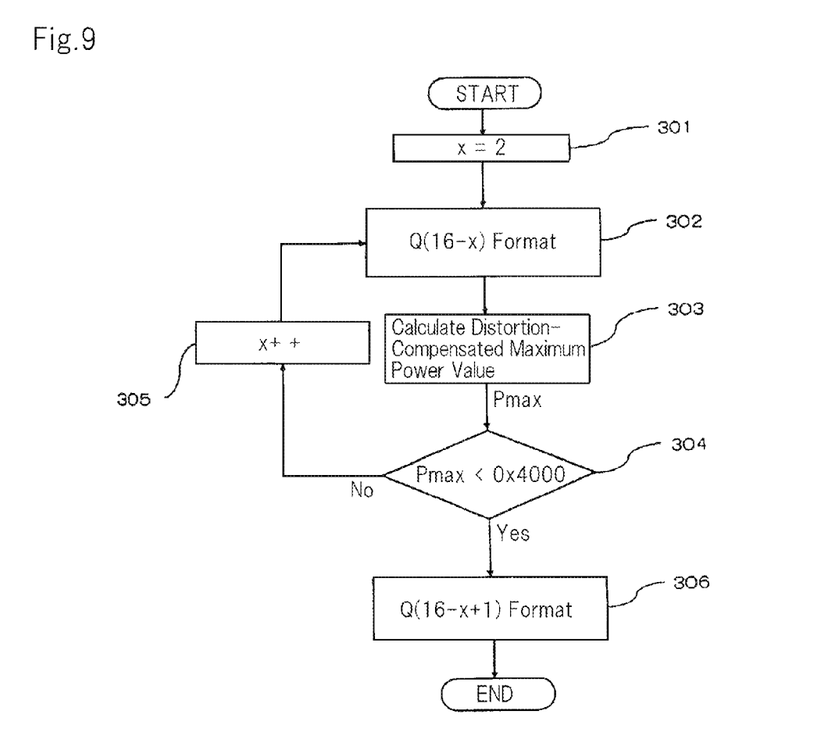
[FIG. 9] is a flow chart showing one example of a specific process for determining a bit format in the second exemplary embodiment.

FIG. 9 is a flow chart showing one example of a specific process for determining the bit format in the second exemplary embodiment. Here, an example of a 16-bit fixed-point operation will be given but the processing procedure is the same with another number of bits.

First, bit format determiner 12 puts variable x equal to 2 at Step 301. Then, bit format determiner 12 selects signed Q(16−x) format at Step 302. The signed Q(16−x) format is a format that expresses the sign with one bit, the integer part with x−1 bits and the decimal part with 16-x bits. For example, when variable x=2, the signed Q14 format will be selected.

Next, at Step 303, distortion compensation-operated maximum power value calculator 11 calculates the maximum power value Pmax after a distortion compensating operation, represented in the signed Q(16−x) format selected at Step 302.

Next, bit format determiner 12 compares the maximum power value Pmax calculated by distortion compensation-operated maximum power value calculator 11 with 0x4000, at Step 304.

If Pmax<0x4000, bit format determiner 12 determines Q(16−x+1) format to be used at non-linear distortion compensating operation unit 7 (Step 306). On the other hand, if Pmax≥0x4000, bit format determiner 12 increments variable x at Step 305 and returns to Step 302.

The meaning of the bit format determining process of the present exemplary embodiment described heretofore will be described next.

Since in a 16-bit fixed point format, MSB expresses the sign, the next bit is the highest bit of the bits that express the integer part. Accordingly, 0x4000 represents the power value having 1 at the highest bit and 0 in the other bits among the bits for the integer part. The actual value represented by 0x4000 varies depending on the position of the decimal point.

The maximum power value Pmax represented in a certain bit format being equal to 0x4000 or greater, means that the maximum power value Pmax cannot be expressed unless a bit format that has a greater number of bits for the integer part than that of the certain bit format is used. Conversely, the maximum power value Pmax represented in a certain bit format being smaller than 0x4000, means that the maximum power value Pmax can be expressed by the bit format that has a number of bits for the integer part that is reduced by one from that of the certain bit format.

For example, if a 16-bit fixed-point format is used, a bit format that can express the integer part of the maximum power value Pmax with as small a number of bits as possible by increasing the number of bits for the integer part from the signed Q14 format until the maximum power value Pmax can be expressed.

Accordingly, in the present exemplary embodiment, if at Step 306 the signed Q(16−x+1) format is determined by using the variable x when the maximum power value Pmax satisfies Pmax<0x4000 at Step 304, the determined format becomes the bit format that can express the maximum power value Pmax with the highest precision.

Here, in the present exemplary embodiment, an example of 16-bit singed bit format was shown, but the bit format can be determined in the same procedure even using a format that has another number of bits. In that case, instead of 0x4000 in the present invention exemplary embodiment, a numerical value, in which the highest bit among the bits for expressing the integer part alone may be set with 1 while the other bits are set with 0, may be used.

(The Third Exemplary Embodiment)

In the first and second exemplary embodiments, examples of controlling bit format adaptively while the distortion compensation circuit is performing distortion compensation were illustrated. However, the present invention should not be limited to this. The distortion compensation circuit is acceptable as long as the circuit has a function of enabling use of bit format that suits the compression characteristics of the power amplifier. That is, the distortion compensation circuit does not necessarily need to have a configuration that adaptively updates bit format.

It is not necessary to adaptively update a bit format if the compression characteristics of the power amplifier do not significantly change. For example, a bit format may be determined at the time of bootup. Alternatively, a bit format may be determined at the time of bootup and then may be updated only when some factor that changes the compression characteristics of the power amplifier has occurred.

Figure 10:
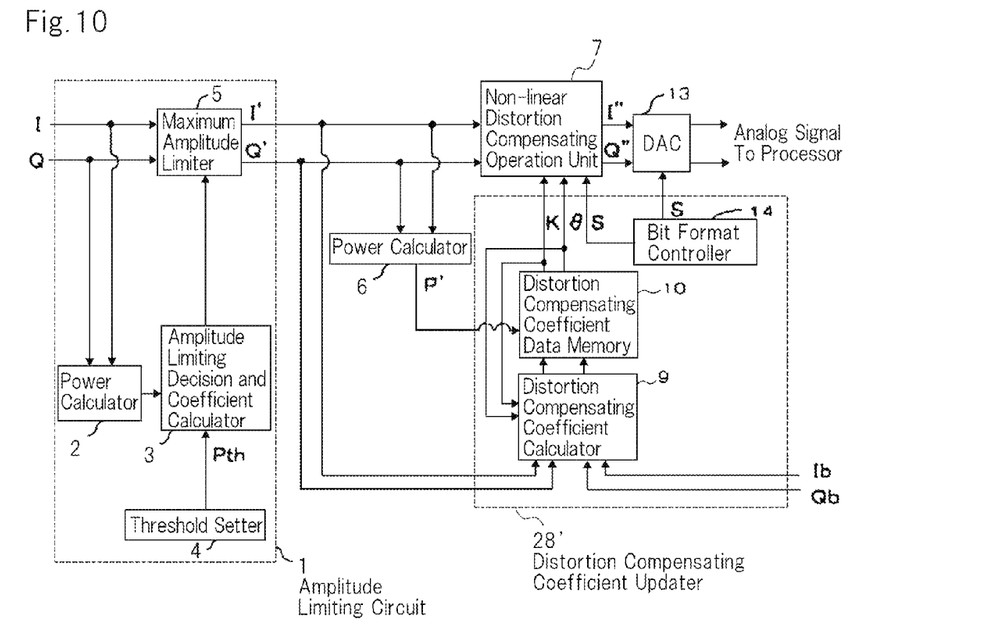
[FIG. 10] is a block diagram showing a configuration of the essential part of a distortion compensation circuit according to the third exemplary embodiment.

The third exemplary embodiment shows a distortion compensation circuit in which a variably set bit format is used for distortion compensating operation. FIG. 10 is a block diagram showing a configuration of the essential part of a distortion compensation circuit according to the third exemplary embodiment.

Referring to FIG. 10, the distortion compensation circuit according to the third exemplary embodiment includes bit format controller 14, instead of distortion compensation-operated maximum power value calculator 11 and bit format determiner 12 in the distortion compensation circuit according to the first exemplary embodiment shown in FIG. 7. Other components in the configuration of the third exemplary embodiment are the same as those in the configuration of the first exemplary embodiment.

Bit format controller 14 is set beforehand with a bit format. This setting of the bit format can be altered as appropriate. Bit format controller 14 notifies set bit format S to non-linear distortion compensator 7 and DAC 13 by a bit format control signal.

Similarly to the first exemplary embodiment, non-linear distortion compensator 7 and DAC 13 use the bit format S notified by the bit format control signal.

According to the present exemplary embodiment, though it is not possible to alter a bit format in an adaptive manner, it is possible to easily apply a suitable bit format that will not cause saturation in a distortion compensating operation and that is high in accuracy to distortion compensation of the amplifier, by setting up a bit format in accordance with the characteristics of the power amplifier. Further, in the present exemplary embodiment, since it is possible to realize with a simpler circuit than those in the first and second exemplary embodiments, it is possible to reduce the circuit scale when the circuit is applied to a case where the characteristics of the power amplifier do not vary greatly during operation.

As has been described heretofore by referring to exemplary embodiments of the present invention, the present invention should not be limited to the above exemplary embodiments. The present invention may be achieved by using a combination of these embodiment modes and exemplary embodiments or by changing part of the configuration within the scope of the technical thought of the present invention.

This application claims priority based on Japanese Patent Application 2008-325617 filed on Dec. 22, 2008, and should incorporates all the disclosure thereof herein.

The invention claimed is:

1. A distortion compensation circuit for compensating for distortion characteristics of an amplifier, comprising:
    a distortion compensating coefficient calculator that calculates a distortion compensating coefficient to be used for compensation of the distortion characteristics by comparing an input signal with an output signal amplified by the amplifier;
    a bit format determiner that sets up a bit format with a predetermined number of bits that expresses a numerical value of a target signal having a first precision with a different, second precision;
    a distortion compensating operation unit that performs a distortion compensating operation on the input signal, using the bit format set by the bit format determiner and the distortion compensating coefficient calculated by the distortion compensating coefficient calculator;
    a distortion compensation-operated maximum amplitude calculator that calculates, based on the distortion compensating coefficient calculated by the distortion compensating coefficient calculator, a maximum amplitude of a distortion-compensated signal input to the amplifier, determined depending on an amount of compression at a saturation output point of the amplifier; and
    a bit format determiner that sets up the bit format so as to be able to express the maximum amplitude calculated by a distortion compensation-operated maximum amplitude calculator.

2. The distortion compensation circuit according to claim 1, wherein the bit format determiner selects the bit format that can express the amplitude with the highest accuracy from those that can express the maximum amplitude, from among a plurality of bit format candidates.

3. The distortion compensation circuit according to claim 1, wherein when determining the bit format, the bit format determiner determines the value of variable x when 2 to the power of x becomes greater than the integer part of the maximum amplitude by incrementing a variable x by one, to be the number of bits for the integer part of the bit format.

4. The distortion compensation circuit according to claim 1, wherein,
    the distortion compensation-operated maximum amplitude calculator expresses the maximum amplitude in the bit format having variable x−1 set as the number of bits for the integer part; and
    the bit format determiner, when determining the bit format, determines the value of variable x−2 when the value of the maximum amplitude expressed by the distortion compensation-operated maximum amplitude calculator becomes smaller than the value consisting of bits for expressing the amplitude of the distortion-compensated signal, in which the highest bit alone is set with 1 and the other bits are set with 0, by incrementing variable x by one, to be the number of bits for the integer part of the bit format.

5. The distortion compensation circuit according to claim 1, wherein while the distortion compensation circuit is performing distortion compensation, the distortion compensation-operated maximum amplitude calculator and the bit format determiner continuously operate so as to adaptively control the bit format to be used by the non-linear distortion compensating operation unit.

6. The distortion compensation circuit according to claim 1, wherein the bit format is a fixed-point type bit format.

7. A transmitting apparatus for transmitting a signal whose distortion characteristics are compensated for, comprising:

a distortion compensating coefficient calculator that calculates a distortion compensating coefficient to be used for compensation of the distortion characteristics by comparing an input signal with a signal obtained by feeding back a transmission signal;

a bit format determiner that sets up a bit format with a predetermined number of bits that expresses a numerical value of a target signal having a first precision with a different, second precision;

a distortion compensating operation unit that performs operation of the distortion compensation on the input signal, using the bit format set by the bit format determiner and the distortion compensating coefficient calculated by the distortion compensating coefficient calculator, to output a signal after a distortion compensating operation;

an amplifier that generates the transmission signal by amplifying the signal after distortion compensating operation output from the distortion compensating operation unit;

a distortion compensation-operated maximum amplitude calculator that calculates, based on the distortion compensating coefficient calculated by the distortion compensating coefficient calculator, a maximum amplitude of a distortion-compensated signal input to the amplifier, determined depending on an amount of compression at a saturation output point of the amplifier; and a bit format determiner that sets up the bit format so as to be able to express the maximum amplitude calculated by the distortion compensation-operated maximum amplitude calculator.

8. The transmitting apparatus according to claim 7, wherein the bit format determiner selects the bit format that can express the amplitude with the highest accuracy from those that can express the maximum amplitude, from among a plurality of bit format candidates.

9. The transmitting apparatus according to claim 7, wherein when determining the bit format, the bit format determiner determines the value of variable x when 2 to the power of x becomes greater than the integer part of the maximum amplitude by incrementing a variable x by one, to be the number of bits for the integer part of the bit format.

10. The transmitting apparatus according to claim 7, wherein, the distortion compensation-operated maximum amplitude calculator expresses the maximum amplitude in the bit format having variable x−1 set as the number of bits for the integer part; and the bit format determiner, when determining the bit format, determines the value of variable x−2 when the value of the maximum amplitude expressed by the distortion compensation-operated maximum amplitude calculator becomes smaller than the value consisting of bits for expressing the amplitude of the distortion-compensated signal, in which the highest bit alone is set with 1 and the other bits set with 0, by incrementing variable x by one, to be the number of bits for the integer part of the bit format.

11. The transmitting apparatus according to claim 7, wherein while a distortion compensation circuit is performing distortion compensation, the distortion compensation-operated maximum amplitude calculator and the bit format determiner continuously operate so as to adaptively control the bit format to be used by the non-linear distortion compensating operation unit.

12. The transmitting apparatus according to claim 7, wherein the bit format is a fixed-point type bit format.

13. A distortion compensating method for compensating for distortion characteristics of an amplifier, comprising the steps of:

calculating a distortion compensating coefficient to be used for compensation of the distortion characteristics by comparing an input signal with an output signal amplified by the amplifier;

setting a bit format with a predetermined number of bits that expresses a numerical value of a target signal having a first precision with a different, second precision;

performing a distortion compensating operation on the input signal, using the set bit format and the calculated distortion compensating coefficient;

calculating, based on the calculated distortion compensating coefficient, a maximum amplitude of the distortion-compensated signal input to the amplifier, determined depending on an amount of compression at a saturation output point of the amplifier; and setting up the bit format so as to be able to express the calculated maximum amplitude.

14. The distortion compensating method according to claim 13, wherein from among a plurality of bit format candidates, the one that can express the amplitude with the highest accuracy is selected from those that can express the maximum amplitude.

15. The distortion compensating method according to claim 13, wherein in determining the bit format, the value of variable x when 2 to the power of x becomes greater than the integer part of the maximum amplitude by incrementing a variable x by one, is determined to be the number of bits for the integer part of the bit format.

16. The distortion compensating method according to claim 13, wherein in determining the bit format, the value of variable x−2 when the value of the maximum amplitude expressed in the bit format having variable x−1 set as the number of bits for the integer part becomes smaller than the value consisting of bits for expressing the amplitude of the distortion-compensated signal, in which the highest bit alone is set with 1 and the other bits are set with 0, by incrementing variable x by one, is determined to be the number of bits for the integer part of the bit format.

17. The distortion compensating method according to claim 13, wherein while distortion compensation is being performed, a bit format is adaptively controlled.

18. The distortion compensating method according to claim 13, wherein the bit format is a fixed-point type bit format.

* * * * *